United States Patent [19]

Farber et al.

[11] 4,394,435

[45] Jul. 19, 1983

[54] SYNDIOTACTIC POLYBUTADIENE COMPOSITION FOR A PHOTOSENSITIVE PRINTING PLATE

[75] Inventors: Milton Farber, Bethany, Conn.; John R. Worns, Mishawaka, Ind.

[73] Assignee: Uniroyal, Inc., New York, N.Y.

[21] Appl. No.: 307,360

[22] Filed: Oct. 1, 1981

[51] Int. Cl.³ .............................................. G03C 1/68
[52] U.S. Cl. .................................... 430/287; 430/288; 430/905; 430/912; 430/285; 430/281; 204/159.2; 204/159.17
[58] Field of Search ............... 430/912, 905, 281, 286, 430/285, 287, 288; 204/159.17, 159.2

[56] References Cited

U.S. PATENT DOCUMENTS 4,103,057 7/1978 Takimoto et al. .................. 428/220

FOREIGN PATENT DOCUMENTS 1552653 9/1979 United Kingdom ................ 430/286

Primary Examiner—Won H. Louie, Jr.
Attorney, Agent, or Firm—Andrew D. Maslow

[57] ABSTRACT

A photopolymer elastomeric article designed to be used primarily in a flexographic printing system comprising: a polymer matrix made up of a mixture of syndiotactic 1,2-polybutadiene and cis-1,4-polyisoprene; a photoinitiator, which is a compound, which when irradiated, will initiate polymerization and/or crosslinking; and optionally, 0–3 phr of photopolymerizable, ethylenically unsaturated crosslinking agent, as typified by esters of acrylic or methacrylic acid.

26 Claims, No Drawings

SYNDIOTACTIC POLYBUTADIENE COMPOSITION FOR A PHOTOSENSITIVE PRINTING PLATE

BACKGROUND OF THE INVENTION

1. Field of the Invention

The present invention relates to a photopolymer elastomeric article which is designed to be used in a flexographic printing system. Flexographic printing is a method of rotary letterpress printing which employs flexible elastomer printing plates. In this system the ink is transferred directly from the raised surfaces of the elastomeric plate to the printing stock. Those properties most desirable in flexible photopolymer plates include resistance to the wide variety of solvents used in printing inks, good ink transfer from plate to substrate, proper hardness (durometer), short plate processing time, resistance to ozone and oxidative cracking, and resistance to post-hardening.

Flexible photopolymer printing plates in the prior art have usually been made up of:

1. An elastomeric polymer matrix;
2. A photopolymerizable, ethylenically unsaturated crosslinking agent, as typified by esters of acrylic or methacrylic acid ("monomer"); and
3. A photoinitiator, which is a compound, which when irradiated, will initiate polymerization and/or crosslinking.

The chemical nature of these three elements has been varied and additional components have been added as needed to improve plate production and performance characteristics, especially printing quality.

It has been assumed in the prior art that large amounts, i.e., greater than 5 phr (parts per hundred of rubber) of the photopolymerizable ethylenically unsaturated, crosslinking agent are required to produce a commercially acceptable photopolymer flexographic printing plate. The current invention, however, employs a mixture of syndiotactic 1,2-polybutadiene (SBD) and 30% by weight or greater of cis-1,4-polyisoprene (cis-IR), which requires no, or optionally no more than 3 phr of crosslinking agent. The resultant flexographic printing plate shows excellent printing qualities, is highly resistant to the ozone cracking caused by the high concentrations of ozone in the areas of some flexographic presses, and is easy to process.

2. Description of the Prior Art

U.S. Pat. No. 2,760,863 discloses a process to make relief images from a photopolymerizable system containing a polymeric thickener or filler, an addition polymerizable monomer, and a photopolymerization initiator.

U.S. Pat. No. 3,024,180 and Canadian No. 614,181 disclose relief plates based on polymers of 1,3-butadiene and halogen-substituted 1,3-butadiene, and mention copolymers thereof with aryl olefins, e.g., styrene, acrylic esters and nitriles.

U.S. Pat. No. 3,674,486 discloses printing plate compositions based on block copolymers of styrene and butadiene (SBS) or isoprene (SIS).

U.S. Pat. No. 3,764,324 discloses a printing plate formulation consisting of an unsaturated copolymer derived from butadiene and acrylonitrile, and a saturated halogenated polymer, such as polyvinylchloride, which results in a hard solvent resistant plate.

British Pat. No. 1,552,653 discloses the use of SBD as a polymer matrix and of cis-IR as a plasticizer therewith, but teaches the use of a monomer in much greater amounts than 3 phr (at least 5 phr) as being essential to produce an acceptable product, and discloses only up to 23% cis-IR in said mixture.

U.S. Pat. No. 4,103,057 and its British equivalent British Pat. No. 1,481,212, which have been assigned to the same assignee as British Pat. No. 1,552,653, disclose a photocurable SBD composition with no monomer used for insolubilizing previously mechanically molded patterns, but do not teach the use of those compositions to produce such patterns by photochemical insolubilization.

U.S. Pat. No. 4,045,231 discloses a photosensitive resin composition for flexographic printing plates comprising (a) a styrene-butadiene block copolymer containing 35-50% by weight of styrene; (b) at least one liquid prepolymer having a molecular weight of 1,000 to 5,000 selected from the group consisting of polybutadiene and butadiene-styrene copolymer; (c) a monomer containing at least one vinyl group, such as glycol methacrylates; and (d) a photopolymerization initiator, such as benzophenone.

U.S. Pat. No. 4,137,081 describes photopolymer compositions containing a liquid polymer having at least two terminal olefin groups attached to the polymer and photopolymerized in the presence of from 1 to about 50% by weight, based on the liquid polymer, of at least one ethylenically unsaturated monomer.

None of the above references disclose a flexible photopolymer plate in which the polymer matrix is a mixture of SBD and cis-IR, with cis-IR being 30% or greater, with no or optionally, no more than 3 phr of photopolymerizable crosslinking agent.

SUMMARY OF THE INVENTION

The present invention is a flexible photopolymer printing plate comprising: (1) a mixture of syndiotactic 1,2-polybutadiene and cis-IR; (2) an addition polymerization initiator activatable by actinic radiation; and (3) optionally, up to 3 phr of a photopolymerizable, ethylenically unsaturated crosslinking agent.

The article of the present invention, comprising a layer of the aforesaid polymerizable composition optionally adhered to a backing layer, is exposed to actinic radiation through an image-bearing process transparency, which contains substantially clear and opaque areas, and which has been placed in intimate contact with the photopolymerizable layer. Irradiation causes insolubilization in the area of the layer underneath the clear area of the process transparency, but substantially no insolubilization occurs in the unexposed areas underneath the opaque areas of the process transparency. After this irradiation, the article is treated with a solvent such as a halogenated hydrocarbon, which removes the unexposed soluble areas of the plate. The resulting relief surface can now be used for printing, either as a plate or in sleeve form.

The novelty of the present invention resides in part in the fact that it is unexpected and unknown that a high quality flexographic plate can be made from blends of SBD and at least 30% cis-IR with no or very little (up to 3 phr) photopolymerizable, ethylenically unsaturated crosslinking agent ("monomer"). British Pat. No. 1,552,653 discloses photopolymer flexographic plates made from SBD admixed with monomer. The point is made explicitly in the specification of this patent that a composition without monomer will not yield a useful product, and further that 5 phr is regarded as the absolute minimum amount of monomer. Example 6 of said British Pat. No. 1,552,653 actually demonstrates that the inventors found therein that without monomer, the photopolymer plate is of poor quality.

Although British Pat. No. 1,552,653 discloses the use of cis-polyisoprene as a plasticizer admixed with SBD (up to 23%), nowhere in this patent is there any suggestion that such combinations may be photocured together with little or no monomer (0–3 phr) to yield a useful product. With this combination, in fact, British Pat. No. 1,552,653 teaches the use of 30 phr of lauryl methacrylate plus 10 phr of neopentyl glycol dimethacrylate, both of which are monomers.

Applicants have found that high quality flexographic photopolymer plates can be made from blends of SBD with 30 to 75% cis-IR and no monomer. The small amounts of monomer (0 to 3 phr) optionally added are utilized merely to permit shorter exposure times in the photochemical reaction. Larger amounts of monomer (5 phr and greater) are detrimental in that they cause an undesirable increase in the hardness of the final product. To counteract this, plasticizers, which are costly, lower physical properties and can be leached out during processing and printing must be resorted to. This is highly undesirable.

DESCRIPTION OF THE PREFERRED EMBODIMENTS OF THE INVENTION

As noted, the flexible photopolymer printing plates of the present invention comprise three major elements: (1) an elastomeric polymer matrix; (2) a photoinitiator; and (3) optionally up to 3 phr of a photopolymerizable, ethylenically unsaturated crosslinking agent.

In the present invention, the syndiotactic 1,2-polybutadiene portion of the elastomeric matrix includes such polymers with substantially no crystallinity to about 50% crystallinity. Practical limits of crystallinity are dictated by the degree of hardness desired in the final product, since increased crystallinity is linked with higher hardness and vice-versa. The preferred range of crystallinity for the present invention is 5 to 20%. The content of 1,2-units (pendant vinyl groups) in the SBD is at least 85%, and the molecular weight is in excess of 100,000.

The cis-IR component of the elastomeric matrix can be of either the naturally occurring variety ("natural rubber") or the synthetic variety. Its molecular weight will be in excess of 10,000 and its cis-1,4-content at least 95%. The preferred polymer is a synthetic material of specific gravity ca. 0.91 and a Mooney viscosity (100° C.) of 30 to 65.

The composition of the elastomeric matrix can vary from 30 to 70% by weight of the SBD and correspondingly 70 to 30% of the cis-IR. The preferred composition range is from 50 to 70% SBD with 50 to 30% cis-IR. The presence of the cis-IR in the amount of 30% or more is additionally advantageous because it is elastomeric in nature, whereas the SBD is more resin-like. This permits the ready adjustment of hardness to any level needed for flexographic printing. The high uncured strength of cis-IR, furthermore, improves the processability and handling of the flexible photopolymer plates in the uncured state. Dimensional stability and gauge uniformity, critical properties in these printing plates, are enhanced by the presence of the cis-IR.

The addition polymerization and/or crosslinking initiators useful in the present invention are those activatable by actinic light and thermally inactive at and below 185° C. These initiators include aromatic ketones, such as benzophenone and substituted benzophenones, the substituted or unsubstituted polynuclear quinones, which are compounds having two intracyclic carbonyl groups attached to intracyclic carbon atoms in a conjugated six-membered carbocyclic ring, there being at least one aromatic carbocyclic ring fused to the ring containing the carbonyl groups. Suitable such initiators include 9,10-anthraquinone, 1-chloroanthraquinone, 2-chloroanthraquinone, 2-methylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alpha-sulfonic acid, 3-chloro-2-methylanthraquinone, α-retenequinone, 7,8,9,10-tetrahydronaphthacenequinone, and 1,2,3,4-tetrahydrobenzanthracene-7,12-dione. Other photoinitiators which are also useful are described in U.S. Pat. No. 2,760,863 and include vicinal ketaldonyl compounds, such as diacetyl, benzil, etc.; α-ketaldonyl alcohols, such as benzoin, pivaloin, etc.; acyloin ethers, e.g., benzoin methyl and ethyl ethers, etc.; α-hydrocarbon substituted aromatic acyloins, including α-methylbenzoin, α-allylbenzoin, α-phenylbenzoin and 2,2-dialkoxy-2-phenylacetophenones. Preferred initiators include 2,2-dimethoxy-2-phenylacetophenone, $C_1$ to $C_5$ alkyl ethers of benzoin, and benzophenone. The concentration range may be 0.1 to 5 parts per hundred of elastomer, with 1 to 3 being preferred.

The optionally added photopolymerizable ethylenically unsaturated crosslinking agents suitable for use in the invention include unsaturated esters of polyols, particularly such esters with alphamethylene carboxylic acids, e.g., ethylene glycol diacrylate, diethylene glycol diacrylate, glycerol diacrylate, glycerol triacrylate, mannitol polyacrylate, sorbitol polyacrylate, ethylene glycol dimethacrylate, 1,3-propanediol dimethacrylate, 1,2,4-butanetriol trimethacrylate, 1,4-butanediol diacrylate and dimethacrylate, 1,4-cyclohexanediol diacrylate, 1,4-benzenediol dimethacrylate, isosorbidene diacrylate, pentaerythritol di-, tri-, and tetra-methacrylate, dipentaerythritol polyacrylate, pentaerythritol di-, tri-, and tetra-acrylates, 1,3-propanediol diacrylate, 1,6-hexanediol diacrylate and dimethacrylate, 1,5-pentanediol dimethacrylate, trimethylolpropane triacrylate and trimethacrylate, the bisacrylates and bismehyacrylate of polyethylene glycols of molecular weight 200 to 4000; unsaturated amides, particularly those of the alpha-methylene carboxylic acids, and especially those of alpha, omega-diamines and oxygen-interrupted omega-diamines, such as methylene bisacrylamide, methylene bismethacrylamide, ethylene bismethacrylamide, 1,6-hexamethylene bisacrylamide, diethylene triamine trimethacrylamide, 1,2-di(gamma-methacrylamidopropoxy)ethane, beta-methacrylamidoethyl methacrylate, N-(beta-hydroxyethyl)-2-(methacrylamido)ethyl acrylate and N,N-bis(beta-methacrylyloxyethyl)acrylamide; vinyl esters, such as divinyl succinate, divinyl adipate, divinyl phthalate, divinyl terephthalate, divinylbenzene-1,3-disulfonate, divinylbutane-1,4-disulfonate and unsaturated aldehydes, such as sorbaldehyde (hexadienal). An outstanding class of those preferred addition polymerizable crosslinking agents are the esters and amides of alpha-methylene carboxylic acids and substituted carboxylic acids with polyols and polyamides wherein the molecular chain between the hydroxyls and amino groups is solely carbon or oxygen-interrupted carbon.

The amount of optionally added photopolymerizable ethylenically unsaturated crosslinking agent ("monomer") may range from about 0 to 3 phr, with 0.5 to 2 being preferred. This is used only when it is desired to shorten the exposure times in the photochemical reaction used to produce the final printing plate. High quality plates can be produced without these monomers. Larger amounts of monomer (5 phr and greater) and detrimental since such amounts bring about an undesirable increase in hardness of the composition.

The photosensitive composition is prepared by mixing the elements either in solution, on an open mill, or in an internal mixer for a time long enough to incorporate the ingredients homogeneously, usually several minutes. The composition is then cast, compression molded or extruded to the desired thickness in sheet or sleeve form. It is irradiated through a black and white transparency with a high intensity UV source for a time sufficient to cure the exposed areas, leaving them solvent resistant. The unexposed areas are then removed by brushing or washing with solvents, leaving the crosslinked insoluble polymer network as the relief plate image. The plate is then dried in a forced air oven.

The supporting substrate for the photosensitive compound must be dimensionally stable and solvent resistant. Commonly used supports are sheet metals, such as aluminum, and plastics, such as polyester and polyamide.

The following examples illustrate the invention.

EXAMPLE 1

Fifty parts of syndiotactic 1,2-polybutadiene (SBD) of crystallinity ca. 15%, melt flow index 3 (at 150° C.) and 0.901 density were mixed on a two roll mill at 90°–100° C. with 50 parts of cis-1,4-polyisoprene (cis-IR), a heterogeneous polymerized elastomer of Mooney viscosity (100° C.) 50 to 65 and 0.91 specific gravity. To the blend on the mill was added as photoinitiator 3 parts of 2,2-dimethoxy-2-phenylacetophenone (DMPA) and as an antioxidant, 0.05 parts of tetrakismethylene 3-(3',5'-di-t-butyl-4'-hydroxyphenyl)propionate methane (Irganox 1010$_{tm}$). The compound was compression molded into 0.070" sheets between transparent 0.005" polyester films, one film acting as support, the other as removable cover sheet.

With cover sheet removed, one of the sheets of photopolymer compound was exposed through a black and white transparency for 40 seconds on the back and 10 minutes on the front using a "black light" exposure unit. The transparency had solid areas, fine lines and halftones on it. The unexposed areas were then washed out with perchloroethylene in a rotating brush wash unit and the plate dried at 65° C. Processing of the plate was completed by a 2 minute post-exposure on its face and a 30 second immersion in acidified hypochlorite laundry bleach followed by rinsing in water for detackification. The finished plate showed good resolution, straight fine lines, 0.029" relief, and a Shore A durometer hardness of 46.

EXAMPLE 2

A mixture similar to that described in the preceeding example was made up using a 70/30 ratio of the same SBD to cis-IR. Two parts of DMPA, 0.2 parts of 2,6-di-t-butyl-p-cresol (BHT) and 0.05 parts of Irganox 1010$_{tm}$ were added on the two roll mill and the product was molded into 0.070" sheets as described in Example 1. Exposure with a "black light" unit through a black and white transparency for 30 seconds on the back and 8 minutes face yielded after processing in the previous manner a printing plate with good resolution, 0.031" relief and 55 Shore A durometer hardness.

EXAMPLE 3

The following formulations containing the same SBD and cis-IR used in Example 1 were made up:

|  | Parts by weight | |
|---|---|---|
|  | 3A | 3B |
| SBD | 50 | 70 |
| Cis-IR | 50 | 30 |
| Hexanediol Diacrylate (HDDA) | 1 | 1 |
| DMPA | 2 | 2 |
| BHT | 1 | 1 |
| Irganox 1010 TM | 0.05 | 0.05 |
| Calcium Stearate | 0.2 | 0.2 |

The ingredients were mixed in a sigma blade mixer at 120° C. and then extruded at 130° C. through a flat die into sheets of 0.112" thickness. The sheets had a permanently attached clear 0.005" polyester film support and a similar removable cover sheet. Sheets of each were exposed with cover removed, through a black and white transparency for 2½ minutes backside and 8 minutes face, using a "black light" exposure unit. After washing out the unexposed areas with perchloroethylene, the finished plates had good resolution, 0.33" to 0.038" relief and Shore A durmometer hardnesses of 48 for 3A and 55 for 3B.

EXAMPLE 4

This example serves to demonstrate that as little as 25% SBD admixed with cis-IR will photocure to produce an acceptable flexographic plate. For this purpose, the SBD and cis-IR used in Example 1 were formulated in the ratio of 25 to 75, respectively, along with 2 parts of DMPA, 0.2 parts BHT and 0.05 parts Irganox 1010$_{tm}$. A 0.070" sheet of this compound, when exposed with a transparency in a "black-light" unit for 30 seconds backside and 8 minutes face, yielded a finished flexographic plate of good quality, with 0.031" relief and Shore A durometer of 55.

EXAMPLE 5

To demonstrate the undesirable hardness of SBD/cis-IR photopolymer formulations containing 5 phr and greater than 5 phr of the photopolymerizable crosslinking agent, a 50/50 blend of the two components was made up containing 3 phr DMPA and 0.05 phr Irganox 1010$_{tm}$. To separate portions of this mixture was added 0, 1, 2, 3, 5, 10 and 20 phr of crosslinking agent HDDA ("monomer") and the mixes compression molded to flat plates of 0.070" thickness. The plates were then exposed to UV light in a "black-light" unit through a black and white transparency, processed and dried. The results shown in Table I below indicate that above the level of 3 phr of the HDDA the hardness exceeds 60, which is highly undesirable for a flexographic printing plate.

TABLE I

| PHR HDDA | Exposure Back | Exposure Front | Relief Depth (mils) | Durometer Hardness (Shore A) |
|---|---|---|---|---|
| 0 | 40 sec | 10 min | 28.5 | 46 |
| 1 | 15 sec | 5 min | 29 | 50 |
| 2 | 10 sec | 5 min | 30 | 55 |
| 3 | 7.5 sec | 5 min | 30.5 | 58 |
| 5 | 7.5 sec | 5 min | 31 | 61 |
| 10 | 7.5 sec | 5 min | 32 | 67 |
| 20 | 7.5 sec | 5 min | 32 | 76 |

EXAMPLE 6

A solution in a 3:1 mixture of toluene and methylethylketone (MEK) was made up from 70 parts of the SBD described in Example 1 and 30 parts of a cis-IR having a number average molecular weight of 2,500,000, a Mooney viscosity (100° C.) of 55–60 and a specific gravity of 0.92. To the solution was added 2 phr DMPA and 1 phr HDDA. The solution, at a solids content of 20%, was cast on 0.005" polyester film and the solvent evaporated. Multiple layers were cast, one on top of the other, in this way until a dried thickness of 0.067" was achieved. Samples of this product were exposed in a "black-light" unit through a transparency for 15 seconds backside and 5 minutes face. They were then washed in perchloroethylene to remove unexposed polymer, post-exposed for 2 minutes, hypochlorite treated and dried.

One of these finished plates was mounted on a model 650 Webtron flexographic press and a printing run onto paper was made at 100 feet/min. using black flexographic ink with ethanol as solvent. The printing quality was very good, with good ink transfer and resolution of fine detail.

EXAMPLE 7

Formulations the same as those described in Example 3 were made up, substituting 1 part of trimethylolpropane triacrylate for the HDDA. The ingredients were mixed on a two-roll mill at 90°–100° C. and compression molded between transparent 0.005" polyester films into 0.0070" sheets. When exposed to UV light in a "black-light" unit through an image-bearing transparency and processed as described in the preceding examples, flexographic printing plates of good quality were obtained in both cases, with good resolution and straight lines.

EXAMPLE 8

Flexographic plates are frequently employed to print on polyethylene film which has been treated with a high voltage discharge ("coronizing") to render the film more ink receptive. High ozone concentrations are encountered in areas around these high voltage discharge units so that resistance to ozone cracking is highly desirable in flexographic plates. A finished printing plate made according to the procedure of Example 1 was wrapped around a "2" diameter mandrel and stored in a test chamber at 100° F. in an atmosphere of 50 parts per hundred million ozone in air. After 300 hours of such storage the surface of the plate was unchanged with no sign of any cracking whatsoever. Under the conditions of this test, most unsaturated elastomers will show cracks in less than 20 hours.

What is claimed is:

1. An elastomeric composition for making a printing plate comprising (A) a mixture of syndiotactic 1,2-polybutadiene (SBD) and cis-1,4-polyisoprene (cis-IR); (B) between about 0.1 and 5 phr of a photoinitiator activatable by actinic radiation; and (C) from 0 to 3 phr of a photopolymerizable ethylenically unsaturated compound, wherein (A) comprises 30 to 75% cis-IR and correspondingly 70 to 25% SBD by weight.

2. An elastomeric composition for making a printing plate consisting of a mixture of syndiotactic 1,2, polybutadiene (SBD) and cis-1,4, polyisoprene (cis-IR) and between about 0.1 and 5 phr of a photoinitiator activatable by actinic radiation, wherein (A) contains between 30 and 75% by weight of cis-IR and correspondingly, 70 to 25% SBD by weight.

3. An elastomeric article defined in claim 1 wherein (C) comprises from 0.5 to 2.0 phr.

4. The elastomeric composition defined in claim 3 wherein (C) is an ester of acrylic acid.

5. The elastomeric composition defined in claim 3 wherein (C) is an ester of methacrylic acid.

6. The elastomeric composition defined in claim 3 wherein (C) is a photopolymerizable ethylenically unsaturated compound selected from the group consisting of ethylene glycol diacrylate, ethylene glycol dimethacrylate, diethylene glycol diacrylate, diethylene glycol dimethacrylate, 1,4-butanediol diacrylate, 1,4-butanediol dimethacrylate, 1,6-hexanediol diacrylate, 1,6-hexanediol dimethacrylate, trimethylolpropane triacrylate, trimethylolpropane trimethacrylate, or blends thereof.

7. The elastomeric composition defined in claim 6 wherein (C) is ethylene glycol diacrylate.

8. The elastomeric composition defined in claim 6 wherein (C) is ethylene glycol dimethacrylate.

9. The elastomeric composition defined in claim 6 wherein (C) is diethylene glycol diacrylate.

10. The elastomeric composition defined in claim 6 wherein (C) is diethylene glycol dimethacrylate.

11. The elastomeric composition defined in claim 6 wherein (C) is 1,4-butanediol diacrylate.

12. The elastomeric composition defined in claim 6 wherein (C) is 1,4-butanediol dimethacrylate.

13. The elastomeric composition defined in claim 6 wherein (C) is 1,6-hexanediol diacrylate.

14. The elastomeric composition defined in claim 6 wherein (C) is 1,6-hexanediol dimethacrylate.

15. The elastomeric composition defined in claim 6 wherein (C) is trimethylolpropane triacrylate.

16. The elastomeric composition defined in claim 6 wherein (C) is trimethylolpropane trimethacrylate.

17. The elastomeric composition defined in claim 6 wherein (B) is benzophenone.

18. The elastomeric composition defined in claim 6 wherein (B) is $C_1$-$C_5$alkyl ethers of benzoin.

19. The elastomeric composition defined in claim 6 wherein (B) is benzil.

20. The elastomeric composition defined in claim 6 wherein (B) is $C_1$-$C_5$alkyl monoketals of benzil.

21. The elastomeric composition defined in claim 6 wherein (B) is 2,2-dimethoxy-2-phenylacetophenone.

22. The elastomeric composition defined in claim 1, wherein (A) is a mixture of 50% sydiotactic polybutadiene and 50% cis-IR; (B) is 2 to 3 phr 2,2-dimethoxy-2-phenylacetophenone; and (C) is 1 to 2 phr hexanediol diacrylate.

23. The elastomeric composition defined in claim 22 wherein (A) is a mixture of 70% syndiotactic polybutadiene and 30% of cis-IR.

24. The elastomeric composition defined in claim 1 wherein said SBD is from 5 to 20% crystalline.

25. The elastomeric composition defined in claim 24 wherein said cis-IR has a Mooney viscosity at 100° of from 30 to 65.

26. The elastomeric composition defined in claim 24 wherein said mixture of (A) comprises 30 to 70% SBD by weight and correspondingly 70 to 30% cis-IR by weight.

* * * * *